United States Patent
Wu et al.

(10) Patent No.: US 11,587,989 B2
(45) Date of Patent: Feb. 21, 2023

(54) DISPLAY DEVICE AND DISPLAY PANEL

(71) Applicants: Chongqing BOE Display Technology Co., Ltd., Chongqing (CN); BOE TECHNOLOGY GROUP CO., LTD., Beijing (CN)

(72) Inventors: Xinwei Wu, Beijing (CN); Shicheng Sun, Beijing (CN); Zhen Zhang, Beijing (CN); Wei Zhang, Beijing (CN); Cunzhi Li, Beijing (CN); Jonguk Kwak, Beijing (CN)

(73) Assignees: CHONGQING BOE DISPLAY TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 166 days.

(21) Appl. No.: 16/929,361

(22) Filed: Jul. 15, 2020

(65) Prior Publication Data
US 2021/0050390 A1    Feb. 18, 2021

(30) Foreign Application Priority Data
Aug. 14, 2019    (CN) .......................... 201910750370.X

(51) Int. Cl.
*H01L 29/08*    (2006.01)
*H01L 27/32*    (2006.01)
(Continued)

(52) U.S. Cl.
CPC ...... *H01L 27/3223* (2013.01); *H01L 27/3244* (2013.01); *H01L 51/5253* (2013.01); *H01L 51/56* (2013.01); *H01L 2227/323* (2013.01)

(58) Field of Classification Search
CPC ............................ H01L 27/3223; H01L 29/08
See application file for complete search history.

(56) References Cited

U.S. PATENT DOCUMENTS

| 2019/0051859 A1* | 2/2019 | Choi .................... H01L 27/3248 |
| 2019/0245159 A1* | 8/2019 | Kim .................... H01L 27/3244 |

(Continued)

FOREIGN PATENT DOCUMENTS

CN    110021631 A    7/2019

OTHER PUBLICATIONS

First Office Action for CN Patent Application No. 201910750370.X dated Apr. 2, 2021.

*Primary Examiner* — Caleb E Henry
(74) *Attorney, Agent, or Firm* — Xsensus LLP

(57) ABSTRACT

The present disclosure relates to a display device, a display panel, and a manufacturing method thereof. The display panel includes a substrate, a driving layer, and a display layer. The substrate has an opening area, a transition area surrounding the opening area, and a display area surrounding the transition area. The driving layer is disposed on a side of the substrate and covers at least the transition area and the display area, an area of the driving layer being located in the transition area being provided with a separation groove surrounding the opening area, the separation groove including a first groove body and a second groove body sequentially communicated toward the substrate in a direction perpendicular to the substrate, and a distance between bottom ends of side walls of the first groove body being smaller than a distance between top ends of side walls of the second groove body.

13 Claims, 3 Drawing Sheets

(51) Int. Cl.
  *H01L 51/52*   (2006.01)
  *H01L 51/56*   (2006.01)

(56) References Cited

U.S. PATENT DOCUMENTS

| | | | |
|---|---|---|---|
| 2019/0288047 A1* | 9/2019 | Jeong | H01L 27/323 |
| 2019/0334120 A1* | 10/2019 | Seo | H01L 51/5253 |
| 2019/0355930 A1* | 11/2019 | Lee | H01L 27/326 |
| 2020/0073500 A1* | 3/2020 | Jeong | G06F 3/0412 |
| 2020/0105853 A1* | 4/2020 | Kwon | H01L 27/3272 |
| 2020/0106046 A1* | 4/2020 | Kim | H01L 51/0097 |
| 2020/0110525 A1* | 4/2020 | Park | H01L 27/3276 |
| 2020/0144341 A1* | 5/2020 | Choi | H01L 27/3258 |
| 2020/0176520 A1* | 6/2020 | Kim | H01L 51/5253 |
| 2020/0212140 A1* | 7/2020 | Huh | H01L 27/3234 |
| 2020/0267293 A1* | 8/2020 | Noh | G06F 1/1626 |

* cited by examiner

DISPLAY DEVICE AND DISPLAY PANEL

CROSS-REFERENCE TO RELATED APPLICATION

The present application claims the benefit of and priority to Chinese Patent Application No. 201910750370.X filed on Aug. 14, 2019, the entire contents of which are hereby incorporated by reference.

TECHNICAL FIELD

The present disclosure relates to the field of display technologies and, in particular, to a display device, a display panel, and a manufacturing method thereof.

BACKGROUND

At present, for terminal devices, such as mobile phones and computers, it is often necessary to form an opening in a display panel in order to dispose a device, such as a camera, to reduce a width of an edge of the display panel. However, for an organic light-emitting diode (OLED) display panel, due to existence of the opening, water and oxygen in the air may penetrate into a display area along an organic light-emitting layer, thereby eroding a display device and affecting its display effect.

It should be noted that the information disclosed in the Background section above is only for enhancing the understanding of the background of the present disclosure and thus, may include information that does not constitute prior art known to those of ordinary skill in the art.

SUMMARY

An objective of the present disclosure is to provide a display device, a display panel, and a manufacturing method for a display panel.

According to an aspect of the present disclosure, there is provided a display panel, including:

a substrate having an opening area, a transition area surrounding the opening area, and a display area surrounding the transition area;

a driving layer disposed on a side of the substrate and covering at least the transition area and the display area, wherein an area of the driving layer located in the transition area is provided with a separation groove surrounding the opening area, the separation groove includes a first groove body and a second groove body which are sequentially communicated toward the substrate in a direction perpendicular to the substrate, and a distance between bottom ends of two side walls of the first groove body is smaller than a distance between top ends of two side walls of the second groove body; and a display layer covering the driving layer, and including a light-emitting layer, wherein the light-emitting layer is discontinuous in the second groove body, and an area of the display layer located in the opening area is provided with a through hole at least penetrating the display layer and the driving layer.

In some embodiments of the present disclosure, the driving layer includes:

a gate disposed on the substrate and located in the display area;

a gate insulator layer covering the gate and covering at least the transition area and the display area;

an active layer disposed on a surface of the gate insulator layer away from the substrate and directly opposite to the gate;

an insulator layer covering the active layer and the gate insulator layer; and a source and a drain disposed on a surface of the insulator layer away from the substrate, and coupled to both ends of the active layer;

wherein the separation groove extends from the insulator layer to the gate insulator layer in the direction perpendicular to the substrate.

In some embodiments of the present disclosure, a bottom of the second groove body exposes the substrate, and a height of the second groove body in the direction perpendicular to the substrate is same as a thickness of the gate.

In some embodiments of the present disclosure, the two side walls of the first groove body are perpendicular to the substrate or contract toward the substrate, and the two side walls of the second groove body are perpendicular to the substrate.

In some embodiments of the present disclosure, the display panel further includes:

a packaging layer covering the display layer and filling the separation groove.

According to an aspect of the present disclosure, there is provided a manufacturing method for a display panel, including:

providing a substrate having an opening area, a transition area surrounding the opening area, and a display area surrounding the transition area;

forming a separation ring and a driving layer covering at least the transition area and the display area on a side of the substrate, wherein the separation ring is located in the transition area and surrounds the opening area;

providing a first groove body surrounding the opening area in an area of the driving layer located in the transition area, wherein the first groove body exposes the separation ring, and bottom ends of two side walls of the first groove body are between two side walls of the separation ring;

removing the separation ring to form a second groove body in the driving layer in a direction perpendicular to the substrate, wherein the second groove body is in communication with the first groove body;

forming a display layer covering the driving layer, wherein the display layer includes a light-emitting layer, and the light-emitting layer is discontinuous in the second groove body; and providing a through hole in an area of the display layer located in the opening area, wherein the through hole at least penetrates the display layer and the driving layer.

In some embodiments of the present disclosure, the step of forming a separation ring and a driving layer covering at least the transition area and the display area on a side of the substrate includes:

forming a gate and the separation ring on the substrate by one patterning process, wherein the gate is located on the display area, and the separation ring is located on the transition area and surrounds the opening area;

forming a gate insulator layer covering the gate, the separation ring and the substrate;

forming an active layer directly opposite to the gate on a surface of the gate insulator layer away from the substrate;

forming an insulator layer covering the active layer and the gate insulator layer; and forming a source and a drain on a surface of the insulator layer away from the substrate, wherein the source and the drain are coupled to both ends of the active layer;

the step of providing a first groove body surrounding the opening area in an area of the driving layer located in the transition area includes:

providing the first groove body surrounding the opening area in an area of the insulator layer located in the transition area, wherein the first groove body penetrates the insulator layer and the gate insulator layer, and exposes the separation ring, and wherein the bottom ends of the two side walls of the first groove body are between the two side walls of the separation ring.

In some embodiments of the present disclosure, the step of removing the separation ring includes:

etching the separation ring via the first groove body to form the second groove body in the driving layer in the direction perpendicular to the substrate, wherein the second groove body is in communication with the first groove body.

In some embodiments of the present disclosure, the method further includes:

forming a packaging layer covering the display layer and filling the separation groove.

According to an aspect of the present disclosure, there is provided a display device including any one of the above-mentioned display panels.

It should be noted that the above general description and the following detailed description are merely exemplary and explanatory and should not be construed as limiting of the disclosure.

BRIEF DESCRIPTION OF THE DRAWINGS

The accompanying drawings, which are incorporated in the specification and constitute a part of the specification, show exemplary embodiments of the present disclosure. The drawings along with the specification explain the principles of the present disclosure. It is apparent that the drawings in the following description show only some of the embodiments of the present disclosure, and other drawings may be obtained by those skilled in the art without departing from the drawings described herein.

DETAILED DESCRIPTION

Figure 1:
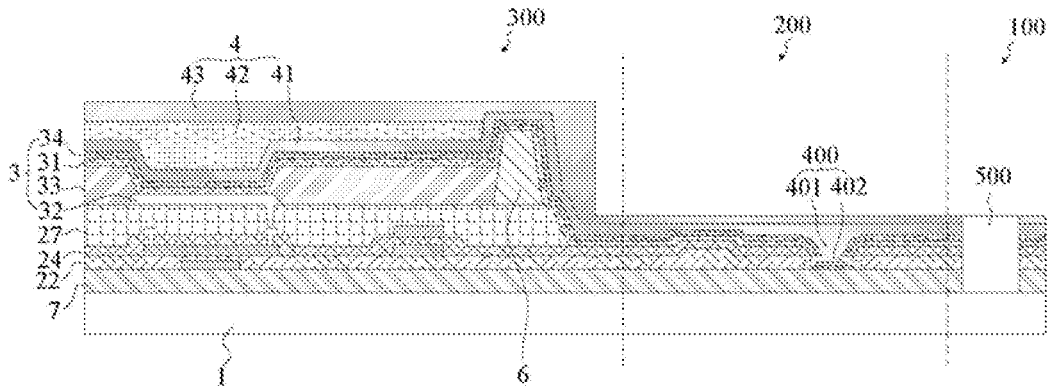
FIG. 1 is a schematic diagram of a display panel in an embodiment of the present disclosure.

Example embodiments will now be described more fully with reference to the accompanying drawings. However, the embodiments can be implemented in a variety of forms and should not be construed as being limited to the examples set forth herein. Rather, these embodiments are provided so that the present disclosure will be more complete so as to convey the idea of the exemplary embodiments to those skilled in this art. The same reference numerals in the drawings denote the same or similar parts, and the repeated description thereof will be omitted. In addition, the drawings are merely schematic representations of the present disclosure and are not necessarily drawn to scale.

Although the relative terms such as "above" and "below" are used in the specification to describe the relative relationship of one component to another component shown, these terms are only for convenience in this specification, for example, according to an exemplary direction shown in the drawings. It will be understood that if the device shown is flipped upside down, the component described as "above" will become a component "below" another component. When a structure is "on" another structure, it may mean that a structure is integrally formed on another structure, or that a structure is "directly" disposed on another structure, or that a structure is "indirectly" disposed on another structure through other structures.

The terms "one," "a," "the," and "said" are used to indicate that there are one or more elements, components, or the like. The terms "include" and "have" are used to indicate an open meaning of including and means that there may be additional elements, components, etc. in addition to the listed elements, components, etc. The terms "first," "second," etc. are used only as reference markers, and do not limit the number of objects.

In the related art, an OLED display panel has an opening area, a transition area surrounding the opening area, and a display area surrounding the transition area. The opening area is provided with a through hole. In order to block a path of water and oxygen erosion, and prevent the water and oxygen from eroding the display area via a light-emitting layer from the through hole, a separation ring surrounding the through hole is disposed in the transition area. The separation ring includes a first metal layer, a second metal layer, and a third metal layer sequentially stacked along a light emitting direction. Inner diameters of the first metal layer and the third metal layer are both less than that of the second metal layer, and outer diameters of the first metal layer and the third metal layer are both larger than that of the second metal layer, such that an inner wall and an outer wall of the separation ring form a groove at an area corresponding to the second metal layer, and the light-emitting layer cannot cover a bottom of the groove to be disconnected. However, portions of the first metal layer and the third metal layer that protrude from the second metal layer are prone to fall off, making it difficult to ensure that the light-emitting layer is discontinuous. In addition, the separation ring is formed of a metal material with poor adhesion to a package layer, and poor packaging is prone to occur. Therefore, the effectiveness of the display panel in the related art to prevent water and oxygen from eroding needs to be improved.

Embodiments of the present disclosure provide a display device, a display panel, and a manufacturing method for a display panel to prevent water and oxygen, among other debris, from entering the display area and eroding the display device.

Figure 5:
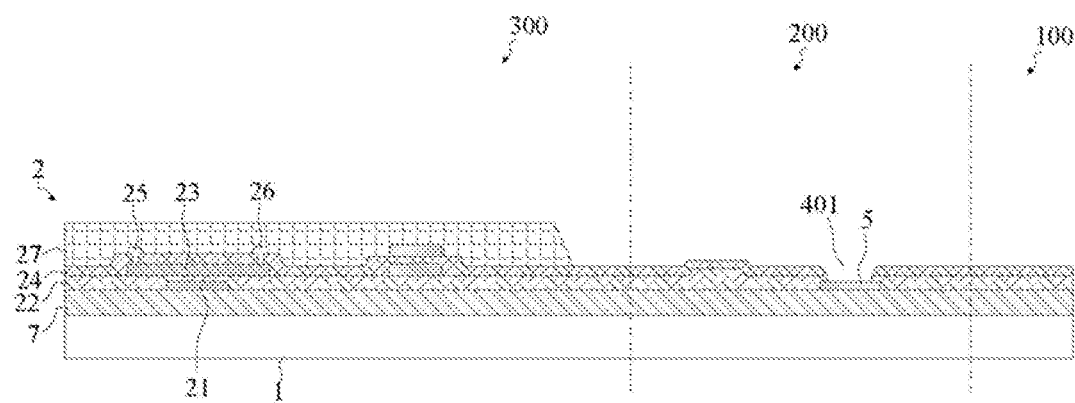
FIG. 5 is a schematic diagram corresponding to a step S130 in FIG. 2.

The embodiments of the present disclosure provide a display panel, which may be the OLED display panel. As shown in FIGS. 1 and 5, the display panel of the present disclosure includes a substrate 1, a driving layer 2, and a display layer 3.

The substrate 1 has an opening area 100, a transition area 200 surrounding the opening area 100, and a display area 300 surrounding the transition area 200.

The driving layer 2 is disposed on a side of the substrate 1 and covers at least the transition area 200 and the display area 300. An area of the driving layer 2 located in the transition area 200 is provided with a separation groove 400 surrounding the opening area 100, the separation groove 400 includes a first groove body 401 and a second groove body 402 which are sequentially communicated toward the substrate 1 in a direction perpendicular to the substrate 1, and a distance between bottom ends of two side walls of the first groove body 401 is smaller than a distance between top ends of two side walls of the second groove body 402.

The display layer 3 covers the driving layer 2 and includes a light-emitting layer 31. The light-emitting layer 31 is discontinuous in the second groove body 402, and an area of the display layer 3 located in the opening area 100 is provided with a through hole 500 penetrating at least the display layer 3 and the driving layer 2.

In the display panel of the embodiments of the present disclosure, the light-emitting layer 31 may be blocked by forming the separation groove 400 in the driving layer 2 to prevent the water and oxygen from entering the display area 300 from the through hole 500 via the light-emitting layer 31 and prevent the display device from being eroded. Specifically, in the separation groove 400, since the distance between the bottom ends of the two side walls of the first groove body 401 is smaller than the distance between the top ends of the two side walls of the second groove body 402, the light-emitting layer 31 when formed cannot cover the side walls of the second groove body 402, so that the light-emitting layer 31 is discontinuous in the second groove body 402, thereby blocking a path of the water and oxygen erosion.

Each portion of the display panel of the present disclosure will be described in detail in the following.

As shown in FIG. 1, the substrate 1 has the opening area 100, the transition area 200, and the display area 300. The opening area 100 is located in an area corresponding to the through hole 500, the transition area 200 is disposed around the opening area 100, and the display area 300 is disposed around the transition area 200, that is, the transition area 200 is located between the opening area 100 and the display area 300. In addition, the substrate 1 may be formed of a hard transparent material such as glass, or a flexible transparent material such as polyethylene terephthalate (PET). A thickness and a shape of the substrate 1 are not particularly limited here.

As shown in FIGS. 1 and 5, the driving layer 2 is disposed on the side of the substrate 1. The driving layer 2 may be directly disposed on a surface of the substrate 1, or disposed on a surface of a buffer layer 7 away from the substrate 1, and the buffer layer 7 is on the substrate 1. The driving layer 2 covers at least the transition area 200 and the display area 300, that is, an orthographic projection of the driving layer 2 on the substrate 1 at least covers the transition area 200 and the display area 300, and in some embodiments, the driving layer 2 further covers the opening area 100. The driving layer 2 is configured to drive the display layer 3 to emit light to display an image. The driving layer 2 may include a plurality of switching devices distributed in an array, and the switching devices may be thin film transistors. As shown in FIGS. 1 and 5, in some embodiments, the switching devices being bottom-gate thin film transistors is taken as an example, and the driving layer 2 may include a gate 21, a gate insulator layer 22, an active layer 23, an insulator layer 24, a source 25, and a drain 26.

The gate 21 is disposed on the substrate 1 and is located within the display area 300.

The gate insulator layer 22 covers the gate 21 and covers the display area 300 and the transition area 200. A material of the gate insulator layer 22 may be silicon oxide or any of other inorganic insulating materials.

The active layer 23 is disposed on a surface of the gate insulator layer 22 away from the substrate 1 and is located within the display area 300. The active layer 23 may include a channel area and a first doped area and a second doped area separated on both sides of the channel area.

The insulator layer 24 may cover the active layer 23 and the gate insulator layer 22, and a material of the insulator layer 24 may include at least one of silicon nitride and silicon carbide, and in some embodiments, any of other inorganic insulating materials may also be used. The insulator layer 24 may be a single-layer or multi-layer structure, which is not particularly limited herein, and if the insulator layer 24 is the multi-layer structure, a material of each of the layers is not limited to a same material.

The source 25 and the drain 26 are disposed on a surface of the insulator layer 24 away from the substrate 1 and are coupled to both ends of the active layer 23. Specifically, the source 25 passes through a first via penetrating the insulator layer 24 to be coupled to the first doped area, and the drain 26 passes through a second via penetrating the insulator layer 24 to be coupled to the second doped area.

In addition, as shown in FIGS. 1 and 5, the driving layer 2 may further include a flat layer 27 that covers the source 25, the drain 26 and the insulator layer 24. The flat layer 27 may be located within the display area 300 or may extend onto the transition area 200 and the opening area 100.

Figure 6:
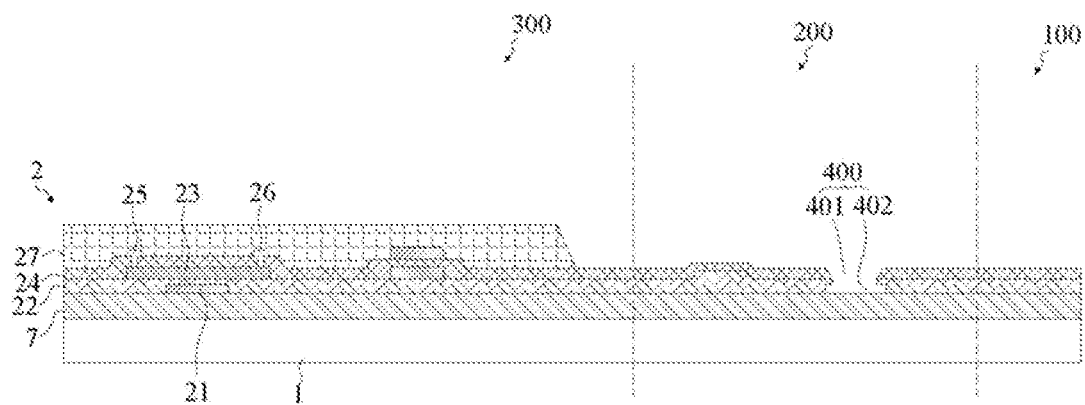
FIG. 6 is a schematic diagram corresponding to a step S140 in FIG. 2.

As shown in FIGS. 1 and 6, the area of the driving layer 2 located in the transition area 200 is provided with the separation groove 400 surrounding the opening area 100, and the separation groove 400 includes the first groove body 401 and the second groove body 402 communicated in the direction perpendicular to the substrate 1, and the second groove body 402 is located between the first groove body 401 and the substrate 1. That is, the first groove body 401 and the second groove body 402 are sequentially communicated along a depth direction of the separation groove 400. Moreover, the distance between the bottom ends of the two side walls of the first groove body 401 is smaller than the distance between the top ends of the two side walls of the second groove body 402, that is, the bottom ends of the two side walls of the first groove body 401 is between the two side walls of the second groove body 402, so that the light-emitting layer 31 of the display layer 3 when formed cannot cover the side walls of the second groove body 402, and the light-emitting layer 31 is discontinuous in the second groove body 402 to cut off the path of the water and oxygen erosion.

In some embodiments, based on the above embodiments using the bottom-gate thin film transistor, the separation groove 400 can extend from the insulator layer 24 to the gate insulator layer 22 in the direction perpendicular to the substrate 1 and expose the substrate 1, that is, a bottom of the second groove body 402 exposes the substrate 1. Further, a height of the second groove body 402 in the direction perpendicular to the substrate 1 is same as a thickness of the gate 21. When the second groove body 402 is to be formed, the gate 21 and a separation ring can be formed by one patterning process. After the separation ring is removed, the second groove body 402 can be formed. The specific processes will be described in embodiments of a manufacturing method below, and will not be described in detail here.

In addition, as shown in FIGS. 1 and 6, the two side walls of the first groove body 401 may be perpendicular to the substrate 1; or, the two side walls of the first groove body 401 may also contract toward the substrate 1, that is, the distance between the two side walls of the first groove body 401 in a horizontal direction gradually decreases along the direction perpendicular to the substrate 1. The two side walls of the first groove body 401 may be smooth or may be formed with steps. The distance between the bottom ends of the two side walls of the first groove 401 is a distance where the distance between the two side walls of the first groove body 401 is the smallest.

The two side walls of the second groove body 402 are perpendicular to the substrate 1, and the distance between the top ends of the two side walls of the second groove body 402 is the distance between the two side walls thereof. In some embodiments, the two side walls of the second groove body 402 may also gradually expand toward the substrate 1, that is, the distance between the two side walls of the second groove body 402 in the horizontal direction gradually increases along the direction perpendicular to the substrate 1. The distance between the top ends of the two side walls of the second groove body 402 is a distance where the distance between the two side walls of the second groove body 402 is the smallest.

A number of the separation grooves 400 may be one or multiple, and if the number of the separation grooves 400 is multiple, diameters of the separation grooves 400 are different from each other, and the separation grooves 400 are distributed in a concentric-ring shape. In addition, a shape of the separation groove 400 may be a ring, a square ring, etc., as long as it is a closed ring structure surrounding the opening area 100.

Figure 7:
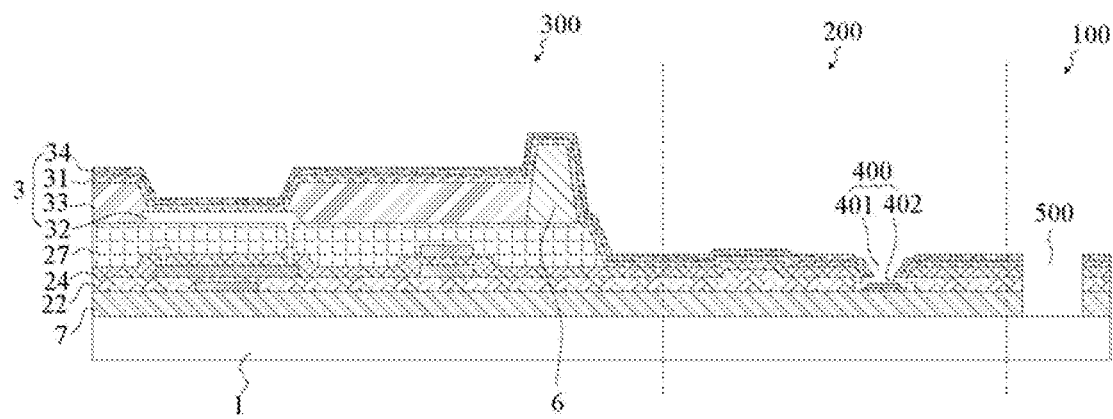
FIG. 7 is a schematic diagram corresponding to a step S160 in FIG. 2.

As shown in FIGS. 1 and 7, the display layer 3 covers the driving layer 2, and the display layer 3 includes the light-emitting layer 31. The light-emitting layer 31 is discontinuous in the second groove body 402, thereby preventing the water and oxygen from entering the display area 300 along the light-emitting layer 31.

In some embodiments, the display layer 3 may include a first electrode 32, a pixel defining layer 33, the light-emitting layer 31, and a second electrode 34.

The first electrode 32 is disposed on the surface of the driving layer 2 away from the substrate 1 and is located within the display area 300, and the first electrode 32 is coupled to the switching device in the driving layer 2. In some embodiments, the switching device in the driving layer 2 is the bottom-gate thin film transistor in the above embodiments, and the first electrode 32 is coupled to the drain 26 of the bottom-gate thin film transistor through a via.

The pixel defining layer 33 may cover the surface of the driving layer 2 away from the substrate 1, and the pixel defining layer 33 has a pixel area exposing the first electrode 32.

The light-emitting layer 31 may be formed of an organic light-emitting material, which covers the pixel defining layer 33 and the first electrode 32 and extends to the transition area 200 and is discontinuous in the second groove body 402. In some embodiments, the light-emitting layer 31 may include a hole injection layer, a hole transport layer, an organic light-emitting layer, an electron transport layer, and an electron injection layer sequentially stacked on the first electrode 32.

The second electrode 34 may cover the light-emitting layer 31, and the second electrode 34 may also extend to the transition area 200 and be discontinuous in the second groove body 402. The light-emitting layer 31 can be made to emit light by the first electrode 32 and the second electrode 34, and a specific light-emitting principle will not be described in detail here.

As shown in FIGS. 1 and 7, the area of the display layer 3 located in the opening area 100 is provided with the through hole 500 at least penetrating the display layer 3 and the driving layer 2. In some embodiments, the through hole 500 may also penetrate the substrate 1. A component such as a camera module and a sensor may be disposed in the through hole 500, which is not specifically limited herein. A boundary of the through hole 500 may coincide with a boundary of the opening area 100 or may be within the boundary of the opening area 100.

As shown in FIG. 1, the display panel of the embodiments of the present disclosure may further include a packaging layer 4 that covers the display layer 3 and fills the separation groove 400. The packaging layer 4 may be the single-layer or multi-layer structure. In some embodiments, the packaging layer 4 may include a first inorganic layer 41, an organic layer 42 and a second inorganic layer 43.

The first inorganic layer 41 covers the display layer 3 and may cover the driving layer 2 and may be formed by a method such as vapor deposition, which may fill the separation groove 400. The organic layer 42 is disposed on a surface of the first inorganic layer 41 away from the substrate 1 and is located within the display area 300. The organic layer 42 can absorb stress. The second inorganic layer 43 covers the organic layer 42 and the first inorganic layer 41, and fills the separation groove 400. The second inorganic layer 43 is formed of an inorganic material, and may also be manufactured by a method such as the vapor deposition.

In addition, as shown in FIG. 1, the display panel of the embodiments of the present disclosure may further include a blocking dam 6. The blocking dam 6 is in a ring shape and may be disposed on the surface of the driving layer 2 away from the substrate 1 and located within the display area 300. The blocking dam 6 surrounds the transition area 200, and is used to prevent the above-mentioned organic layer 42 from moving toward the opening area.

Figure 2:
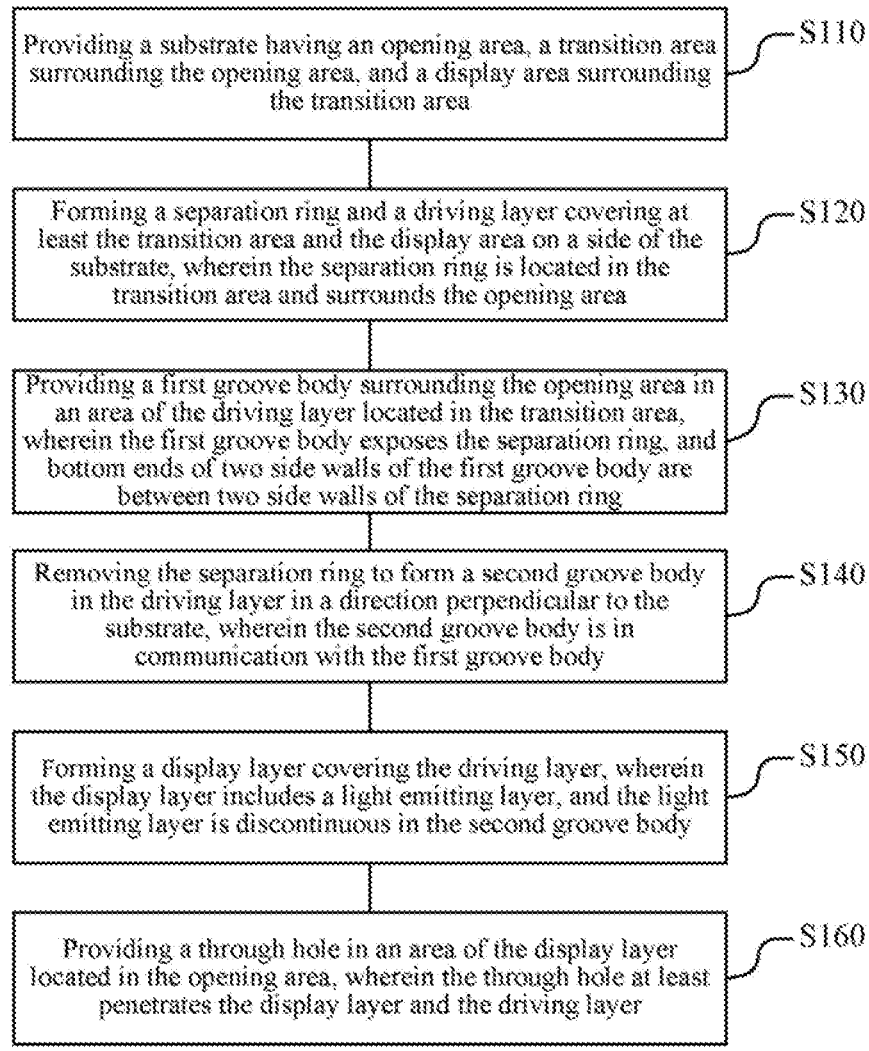
FIG. 2 is a flowchart of a manufacturing method for a display panel in an embodiment of the present disclosure.

Embodiments of the present disclosure also provide a manufacturing method for a display panel, and the display panel may be the display panel of the above embodiments. As shown in FIG. 2, the manufacturing method includes steps S110-S160.

In the step S110, a substrate is provided, which has an opening area, a transition area surrounding the opening area, and a display area surrounding the transition area.

In the step S120, a separation ring and a driving layer covering at least the transition area and the display area are formed on a side of the substrate, and the separation ring is located in the transition area and surrounds the opening area.

In the step S130, a first groove body surrounding the opening area is provided in an area of the driving layer located in the transition area, the first groove body exposes the separation ring, and bottom ends of two side walls of the first groove body are between two side walls of the separation ring.

In the step S140, the separation ring is removed to form a second groove body in the driving layer in a direction perpendicular to the substrate, and the second groove body is in communication with the first groove body.

In the step S150, a display layer covering the driving layer is formed, the display layer includes a light-emitting layer, and the light-emitting layer is discontinuous in the second groove body.

In the step S160, a through hole is provided in an area of the display layer located in the opening area, and the through hole at least penetrates the display layer and the driving layer.

For beneficial effects of the manufacturing method of the present disclosure, reference may be made to the beneficial effects of the display panel above, which will not be repeated here. Each of the steps of the manufacturing method in the embodiments of the present disclosure is described in the following.

Figure 4:
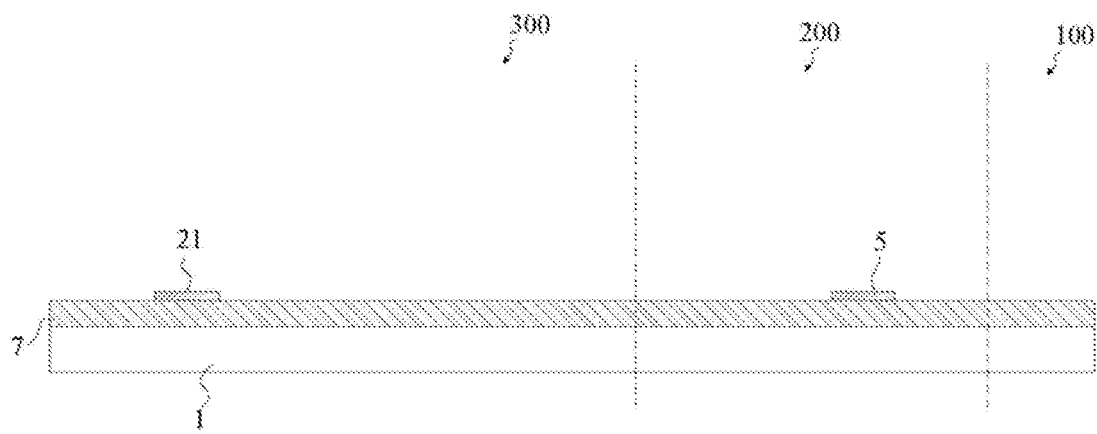
FIG. 4 is a schematic diagram corresponding to a step S1210 in FIG. 3.

In the step S110, as shown in FIG. 4, a specific structure of the substrate 1 has been described in detail in the above embodiments of the display panel, and will not be repeated here.

In the step S120, as shown in FIGS. 5 and 6, the separation ring 5 can be used to occupy a certain space in the driving layer 2. After the separation ring 5 is removed, the second groove body 402 of the separation groove 400 can be formed. In order to simplify processes, the separation ring 5 and one film layer of the driving layer 2 may be formed by one patterning process.

Figure 3:
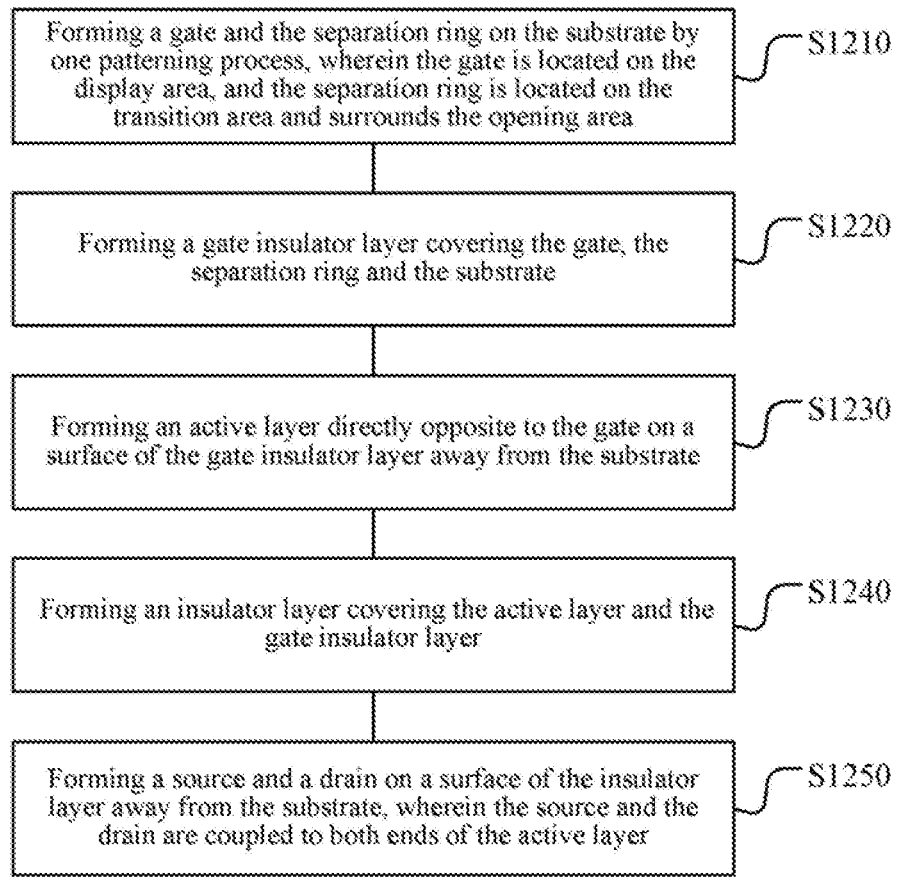
FIG. 3 is a flowchart of a step S120 of a manufacturing method for a display panel in an embodiment of the present disclosure.

In some embodiments, based on the above embodiment of the display panel using the bottom-gate thin film transistor, as shown in FIG. 3, the step S120 may include steps S1210-S1250.

In the step S1210, the gate and the separation ring are formed on the substrate by one patterning process, the gate is located on the display area, and the separation ring is located on the transition area and surrounds the opening area.

As shown in FIG. 4, the gate 21 and the separation ring 5 may use the same material, which may be molybdenum or any of other metals. The gate 21 and the separation ring 5 can be formed on the substrate 1 by one patterning process, the gate 21 is located on the display area 300, and the separation ring 5 is located on the transition area 200 and surrounds the opening area 100. A thickness of the separation ring 5 is same as that of the gate 21. A shape of a cross section of the separation ring 5 may be rectangular, that is, an inner side wall and an outer side wall of the separation ring 5 are perpendicular to the substrate 1. In some embodiments, the cross section of the separation ring 5 may also be trapezoidal.

In the step S1220, a gate insulator layer covering the gate, the separation ring and the substrate is formed.

As shown in FIG. 5, the gate insulator layer 22 may be formed by the vapor deposition or any of other methods. The gate insulator layer 22 covers the gate 21, the separation ring 5, and the substrate 1.

In the step S1230, an active layer directly opposite to the gate is formed on a surface of the gate insulator layer away from the substrate.

In the step S1240, an insulator layer covering the active layer and the gate insulator layer is formed In the step S1250, a source and a drain are formed on a surface of the insulator layer away from the substrate, and the source and the drain are coupled to both ends of the active layer.

As shown in FIG. 5, specific structures of the active layer 23, the insulator layer 24, the source 25, and the drain 26 in the above steps have been described in detail in the above embodiments of the display panel, and will not be repeated here.

In the step S130, as shown in FIG. 5, the area of the driving layer 2 located in the transition area 200 may include an area of the insulator layer 24 and the gate insulator layer 23 located in the transition area 200, which can be etched by dry etching or the like to form the first groove body 401. The first groove body 401 is in the ring shape, and penetrates the insulator layer 24 and the gate insulator layer 23 to expose the separation ring 5. The bottom ends of the two side walls of the first groove body 401 are between the two side walls of the separation ring 5, that is, the distance between the bottom ends of the two side walls of the first groove body 401 is smaller than the distance between the two side walls of the separation ring 5.

In the step S140, as shown in FIG. 6, the separation ring 5 may be etched by a wet etching process via the first groove body 401 until the separation ring 5 is removed to form the second groove body 402. The second groove body 402 communicates with the first groove body in the direction perpendicular to the substrate 1 to form the separation groove 400.

In the step S150, as shown in FIG. 7, the light-emitting layer 31 of the display layer 3 may extend into the separation groove 400, which may cover the side walls of the first groove body 401 and be discontinuous in the second groove body 402.

The step S150 may include steps S1510-S1530.

In the step S1510, a first electrode is formed on the surface of the driving layer away from the substrate.

In the step S1520, a pixel defining layer covering the driving layer is formed, and the pixel defining layer has a pixel area exposing the first electrode.

In the step S1530, the light-emitting layer covering the pixel defining layer and the first electrode is formed, and the light-emitting layer is discontinuous in the second groove body.

In the step S1550, a second electrode covering the light-emitting layer is formed, and the second electrode is discontinuous in the second groove body.

Specific structures of the first electrode, the pixel defining layer and the second electrode in the above steps have been described in detail in the above embodiments of the display panel, and will not be repeated here.

In the step S160, as shown in FIGS. 1 and 7, processes for providing the through hole 500 are not particularly limited here, as long as the through hole 500 can penetrate the display layer 3 and the driving layer 2. The through hole 500 is located in the opening area 100, and has a circular shape, which is not limited to this, and may also has an ellipse shape or any of other shapes, which is not specifically limited herein. The shape and size of the through hole 500 may be the same as those of the opening area 100, or the through hole 500 is located within the opening area. In addition, the through hole 500 may penetrate the driving layer 2 and the display layer 3, and the component such as the camera and the sensor is disposed in the through hole 500. In some embodiments, the through hole 500 may also penetrate the substrate 1.

The manufacturing method of the present disclosure further includes:

in step S170, a packaging layer covering the display layer is formed, and the packaging layer fills the separation groove.

As shown in FIG. 1, for a structure of the packaging layer 4, reference may be made to the packaging layer in the embodiments of the display panel above, which will not be repeated here.

It should be noted that although the various steps of the method of the present disclosure are described in a particular order in the figures, this is not required or implied that the steps must be performed in the specific order, or all the steps shown must be performed to achieve the desired result. Additionally or alternatively, certain steps may be omitted, multiple steps may be combined into one step, and/or one step may be decomposed into multiple steps and so on.

Embodiments of the present disclosure also provide a display device. The display device may include the display panel of the above embodiments, and the structure of the display panel will not be repeated here. The display device can be used in mobile phones, tablet computers or other electronic devices, which will not be listed here one by one. For beneficial effects of the display device, reference may be made to the beneficial effects of the display panel in the above embodiments, which will not be detailed here.

Other embodiments of the present disclosure will be apparent to those skilled in the art after those skilled in the art consider the specification and practice the technical solutions disclosed herein. The present application is intended to cover any variations, uses, or adaptations of the present disclosure, which are in accordance with the general principles of the present disclosure and include common general knowledge or conventional technical means in the art that are not disclosed in the present disclosure. The specification and embodiments are illustrative, and the real scope and spirit of the present disclosure is defined by the appended claims.

What is claimed is:

1. A display panel, comprising:
    a substrate having an opening area, a transition area surrounding the opening area, and a display area surrounding the transition area;
    a driving layer disposed on a side of the substrate and covering at least the transition area and the display area, wherein an area of the driving layer located in the transition area is provided with a separation groove surrounding the opening area, the separation groove comprises a first groove body and a second groove body which are sequentially communicated toward the substrate in a direction perpendicular to the substrate, and a distance between bottom ends of two side walls of the first groove body is smaller than a distance between top ends of two side walls of the second groove body; and
    a display layer covering the driving layer, and comprising a light-emitting layer, wherein the light-emitting layer is discontinuous in the second groove body,
    wherein a number of the separation grooves is multiple, diameters of the multiple separation grooves are different from each other, and the multiple separation grooves are distributed in a concentric-ring shape.

2. The display panel according to claim 1, wherein the driving layer comprises:
    a gate disposed on the substrate and located in the display area;
    a gate insulator layer covering the gate and covering at least the transition area and the display area;
    an active layer disposed on a surface of the gate insulator layer away from the substrate and directly opposite to the gate;
    an insulator layer covering the active layer and the gate insulator layer; and
    a source and a drain disposed on a surface of the insulator layer away from the substrate, and coupled to both ends of the active layer; and
    wherein the separation groove extends from the insulator layer to the gate insulator layer in the direction perpendicular to the substrate.

3. The display panel according to claim 2, wherein a bottom of the second groove body exposes the substrate, and a height of the second groove body in the direction perpendicular to the substrate is same as a thickness of the gate.

4. The display panel according to claim 1, wherein the two side walls of the first groove body are perpendicular to the substrate, and the two side walls of the second groove body are perpendicular to the substrate.

5. The display panel according to claim 1, wherein the display panel further comprises a packaging layer covering the display layer and filling the separation groove.

6. The display panel according to claim 1, wherein an area of the display layer located in the opening area is provided with a through hole at least penetrating the display layer and the driving layer.

7. The display panel according to claim 1, wherein a shape of the separation groove is a closed ring shape surrounding the opening area.

8. The display panel according to claim 1, wherein the two side walls of the first groove body comprises steps.

9. A display device, comprising a display panel, wherein the display panel comprises:
    a substrate having an opening area, a transition area surrounding the opening area, and a display area surrounding the transition area;
    a driving layer disposed on a side of the substrate and covering at least the transition area and the display area, wherein an area of the driving layer located in the transition area is provided with a separation groove surrounding the opening area, the separation groove comprises a first groove body and a second groove body which are sequentially communicated toward the substrate in a direction perpendicular to the substrate, and a distance between bottom ends of two side walls of the first groove body is smaller than a distance between top ends of two side walls of the second groove body; and
    a display layer covering the driving layer, and comprising a light-emitting layer, wherein the light-emitting layer is discontinuous in the second groove body,
    wherein a number of the separation grooves is multiple, diameters of the multiple separation grooves are different from each other, and the multiple separation grooves are distributed in a concentric-ring shape.

10. The display device according to claim 9, wherein the driving layer comprises:
    a gate disposed on the substrate and located in the display area;
    a gate insulator layer covering the gate and covering at least the transition area and the display area;
    an active layer disposed on a surface of the gate insulator layer away from the substrate and directly opposite to the gate;
    an insulator layer covering the active layer and the gate insulator layer; and
    a source and a drain, disposed on a surface of the insulator layer away from the substrate, and coupled to both ends of the active layer; and
    wherein the separation groove extends from the insulator layer to the gate insulator layer in the direction perpendicular to the substrate.

11. The display device according to claim 10, wherein a bottom of the second groove body exposes the substrate, and a height of the second groove body in the direction perpendicular to the substrate is same as a thickness of the gate.

12. The display device according to claim 9, wherein the two side walls of the first groove body are perpendicular to the substrate, and the two side walls of the second groove body are perpendicular to the substrate.

13. The display device according to claim 9, wherein the two side walls of the first groove body comprises steps.

* * * * *